(12) United States Patent
Huai

(10) Patent No.: US 7,576,956 B2
(45) Date of Patent: Aug. 18, 2009

(54) MAGNETIC TUNNEL JUNCTION HAVING DIFFUSION STOP LAYER

(75) Inventor: Yiming Huai, Pleasanton, CA (US)

(73) Assignee: Grandis Inc., Milpitas, CA (US)

( * ) Notice: Subject to any disclaimer, the term of this patent is extended or adjusted under 35 U.S.C. 154(b) by 431 days.

(21) Appl. No.: 11/190,255

(22) Filed: Jul. 26, 2005

(65) Prior Publication Data

US 2006/0018057 A1    Jan. 26, 2006

Related U.S. Application Data

(60) Provisional application No. 60/591,447, filed on Jul. 26, 2004.

(51) Int. Cl.
   *G11B 5/39*    (2006.01)
(52) U.S. Cl. .................... 360/324.2; 360/314
(58) Field of Classification Search ............... 360/324.2
   See application file for complete search history.

(56) References Cited

U.S. PATENT DOCUMENTS

| | | | |
|---|---|---|---|
| 5,695,864 A | 12/1997 | Slonczewski | 428/212 |
| 6,100,188 A * | 8/2000 | Lu et al. | 438/653 |
| 6,124,711 A * | 9/2000 | Tanaka et al. | 324/252 |
| 6,137,662 A | 10/2000 | Huai et al. | 360/327.22 |
| 6,146,775 A | 11/2000 | Fujita et al. | 428/692 |
| 6,172,904 B1 | 1/2001 | Anthony et al. | 365/173 |
| 6,175,476 B1 | 1/2001 | Huai et al. | 360/324.11 |
| 6,201,763 B1 | 3/2001 | Bourgeois et al. | 367/12 |
| 6,211,090 B1 | 4/2001 | Durlam et al. | 438/692 |
| 6,222,707 B1 | 4/2001 | Huai et al. | 360/324.1 |
| 6,266,218 B1 | 7/2001 | Carey et al. | 360/324.12 |
| 6,347,049 B1 * | 2/2002 | Childress et al. | 365/173 |
| 6,351,355 B1 | 2/2002 | Min et al. | 360/324.11 |
| 6,351,409 B1 | 2/2002 | Rizzo et al. | 365/158 |
| 6,381,105 B1 | 4/2002 | Huai et al. | 360/314 |
| 6,438,026 B2 | 8/2002 | Gillies et al. | 365/158 |
| 6,447,935 B1 | 9/2002 | Zhang et al. | 428/692 |
| 6,469,926 B1 * | 10/2002 | Chen | 365/158 |
| 6,518,071 B1 | 2/2003 | Durlam et al. | 438/3 |
| 6,538,859 B1 * | 3/2003 | Gill | 360/324.12 |
| 6,545,906 B1 | 4/2003 | Savtchenko et al. | 365/158 |

(Continued)

FOREIGN PATENT DOCUMENTS

JP    2006-093432    4/2006

(Continued)

OTHER PUBLICATIONS

Cowburn et al., "Lateral interface anisotropy in nanomagnets," Journal of Applied Physics, 87(9):7067-7069 (May 1, 2000).

(Continued)

*Primary Examiner*—Craig A Renner
*Assistant Examiner*—Tamara Ashford
(74) *Attorney, Agent, or Firm*—Fish & Richardson P.C.

(57) ABSTRACT

Magnetic or magnetoresistive tunnel junctions (MTJs) having diffusion stop layers to eliminate or reduce diffusion of oxygen, nitrogen or other particles from the barrier layer to the ferromagnetic layers during the film deposition process including the barrier oxidation or nitridation process and the post annealing process. Such MTJs may be used in various applications including magnetic memory (MRAM) devices and magnetic recording heads.

44 Claims, 8 Drawing Sheets

U.S. PATENT DOCUMENTS

| | | | |
|---|---|---|---|
| 6,603,677 B2 | 8/2003 | Redon et al. | 365/158 |
| 6,633,498 B1 | 10/2003 | Engel et al. | 365/158 |
| 6,649,960 B1 | 11/2003 | Cross | 257/296 |
| 6,687,098 B1 | 2/2004 | Huai | 360/324.12 |
| 6,714,444 B2 | 3/2004 | Huai et al. | 365/171 |
| 6,771,534 B2 | 8/2004 | Stipe | 365/158 |
| 6,791,868 B2 | 9/2004 | Gider et al. | 365/158 |
| 6,801,414 B2 * | 10/2004 | Amano et al. | 360/324.2 |
| 6,829,161 B2 | 12/2004 | Huai et al. | 365/158 |
| 6,838,740 B2 | 1/2005 | Huai et al. | 257/421 |
| 6,847,547 B2 | 1/2005 | Albert et al. | 365/173 |
| 6,888,704 B1 | 5/2005 | Diao et al. | 360/324.1 |
| 6,888,742 B1 | 5/2005 | Nguyen et al. | 365/158 |
| 6,893,741 B2 | 5/2005 | Doerner et al. | 428/670 |
| 6,920,063 B2 | 7/2005 | Huai et al. | 365/171 |
| 6,933,155 B2 | 8/2005 | Albert et al. | 438/3 |
| 6,950,335 B2 | 9/2005 | Dieny et al. | 365/171 |
| 6,958,927 B1 | 10/2005 | Nguyen et al. | 365/158 |
| 6,967,863 B2 | 11/2005 | Huai | 365/158 |
| 6,979,586 B2 | 12/2005 | Guo et al. | 438/48 |
| 6,985,385 B2 | 1/2006 | Nguyen et al. | 365/173 |
| 6,989,972 B1 | 1/2006 | Stoev et al. | 360/322 |
| 6,992,359 B2 | 1/2006 | Nguyen et al. | 257/421 |
| 7,006,375 B2 | 2/2006 | Covington | 365/173 |
| 7,009,877 B1 | 3/2006 | Huai et al. | 365/171 |
| 7,027,268 B1 | 4/2006 | Zhu et al. | 360/314 |
| 7,057,921 B2 | 6/2006 | Valet | 365/158 |
| 7,088,609 B2 | 8/2006 | Valet | 365/158 |
| 7,098,494 B2 | 8/2006 | Pakala et al. | 257/295 |
| 7,105,372 B2 | 9/2006 | Min et al. | 438/48 |
| 7,106,624 B2 | 9/2006 | Huai et al. | 365/171 |
| 7,110,287 B2 | 9/2006 | Huai et al. | 365/171 |
| 7,190,558 B2 * | 3/2007 | Iwasaki et al. | 360/324.11 |
| 7,224,601 B2 | 5/2007 | Panchula et al. | 365/158 |
| 2002/0015823 A1 | 2/2002 | Mauler et al. | 428/156 |
| 2002/0097534 A1 * | 7/2002 | Sun et al. | 360/324.2 |
| 2002/0105827 A1 | 8/2002 | Redon et al. | 365/173 |
| 2003/0222322 A1 | 12/2003 | Park et al. | 257/421 |
| 2004/0130936 A1 | 7/2004 | Nguyen et al. | 365/158 |
| 2004/0136231 A1 | 7/2004 | Huai et al. | 365/158 |
| 2004/0170055 A1 | 9/2004 | Albert et al. | 365/173 |
| 2004/0235201 A1 | 11/2004 | Albert et al. | 438/3 |
| 2005/0041342 A1 | 2/2005 | Huai et al. | 360/324.12 |
| 2005/0063222 A1 | 3/2005 | Huai et al. | 365/171 |
| 2005/0106810 A1 | 5/2005 | Pakala et al. | 438/257 |
| 2005/0110004 A1 * | 5/2005 | Parkin et al. | 257/30 |
| 2005/0136600 A1 | 6/2005 | Huai | 438/296 |
| 2005/0184839 A1 | 8/2005 | Nguyen et al. | 335/173 |
| 2005/0237787 A1 | 10/2005 | Huai et al. | 365/158 |
| 2005/0254286 A1 | 11/2005 | Valet | 365/158 |
| 2005/0254287 A1 | 11/2005 | Valet | 365/158 |
| 2006/0018057 A1 | 1/2006 | Huai et al. | 360/324.2 |
| 2006/0049472 A1 | 3/2006 | Diao et al. | 257/421 |
| 2006/0081953 A1 | 4/2006 | Nguyen et al. | 257/421 |
| 2006/0102969 A1 | 5/2006 | Huai et al. | 257/421 |
| 2006/0114618 A1 | 6/2006 | Masanori et al. | 360/324.1 |
| 2006/0128038 A1 | 6/2006 | Pakala et al. | 438/4 |
| 2006/0141640 A1 | 6/2006 | Huai et al. | 438/3 |
| 2006/0192237 A1 | 8/2006 | Huai | 257/296 |
| 2006/0221676 A1 | 10/2006 | Qian et al. | 365/158 |
| 2006/0281258 A1 | 12/2006 | Dieny et al. | 438/264 |
| 2007/0063236 A1 | 3/2007 | Huai et al. | 257/295 |
| 2007/0063237 A1 | 3/2007 | Huai et al. | 257/295 |
| 2007/0171694 A1 | 7/2007 | Huai et al. | 365/145 |
| 2008/0061388 A1 | 3/2008 | Diao et al. | 257/421 |

FOREIGN PATENT DOCUMENTS

| | | |
|---|---|---|
| WO | WO2007/035786 | 3/2007 |
| WO | WO2007/075889 | 7/2007 |

OTHER PUBLICATIONS

Inomata et al., "Size-independent spin switching field using synthetic antiferromagnets," Applied Physics Letters 82(16): 2667-2669 (Apr. 21, 2003).

Leighton et al., "Coercivity Enhancement in Exchange Biased Systems Driven by Interfacial Magnetic Frustration," Physical Review Letters 84(15): 3466-3469 (Apr. 10, 2000).

Cowache et al., "Spin-valve structures with NiO pinning layers," IEEE Transactions on Magnetics, vol. 34, Iss. 4, part 1, (Jul. 1998) [abstract only].

Dokupil et al., Magnetostriction in combination with GMR/TMR-structures [online] Jun. 2, 2005, [retrieved pn Sep. 5, 2007]<URL: http://www.science24.com/paper/3919>[abstract only].

Devolder, T. et al., "Instability threshold versus switching threshold in spin-transfer-induced magnetization switching", Physical Review B71, 184401-1- 184401-6 (2005).

Mancoff, F.B. et al., "Phase-locking in double-point-contact spin-transfer devices", Nature, vol. 437:393-395 (2005).

Sharrock, M.P. et al., "Kinetic Effects in Coercivity Measurements", IEEE Transactions on Magnetics, vol. Mag-17, No. 6:3020-3022 (1981).

Thirion, C. et al., "Switching of magnetization by nonlinear resonance studied in single nanoparticles", Nature Publishing Group, www.nature.com/naturematerials, vol. 2, 524-527 (2003).

Xi, Haiwen et al., "Spin-current effect on ferromagnetic resonance in patterned magnetic thin film structures", J of Applied Physics 97, 033904 (2005).

Tulapurkar, et al., "Subnanosecond magnetization reversal in magnetic nanopillars by spin angular momentum transfer", *Applied Physics Letters*, vol. 85, No. 22, pp. 5358-5360, Nov. 29, 2004.

Slonczewski, et al., "Current-driven excitation of magnetic multilayers", *Journal of Magnetism and Magnetic Materials*, vol. 159, pp. L1-L7, 1996.

Berger, "Emission of spin waves by a magnetic multilayer traversed by a current", *Physical Review B*, vol. 54, No. 13, pp. 9353-9358, Oct. 1, 1996.

Albert, et al., "Spin-polarized current switching of a Co thin film nanomagnet", *Applied Physics Letters*, vol. 77, No. 23, pp. 3809-3811, Dec. 4, 2000.

Doi, et al., "Magnetism of $Co_{1-x}Fe_x$-NOL in Specular Spin-Valves", *IEEE Transactions on Magnetics*, vol. 40, No. 4, pp. 2263-2265, Jul. 2004.

Zhang, et al., "40% tunneling magnetoresistance after anneal at 380 C for tunnel junctions with iron-oxide interface layers", *Journal of Applied Physics*, vol. 89, No. 11, pp. 6665-6667, Jun. 1, 2001.

* cited by examiner

MAGNETIC TUNNEL JUNCTION HAVING DIFFUSION STOP LAYER

This application claims the benefit of U.S. Provisional Patent Application Ser. No. 60/591,447 entitled "MTJ magnetic elements with diffusion stop layers and an MARM device using the magnetic element" and filed Jul. 26, 2004, the entire disclosure of which is incorporated herein by reference as part of the specification of this application.

BACKGROUND

This application relates to magnetic materials and structures having magnetic tunnel junctions.

A magnetic or magnetoresistive tunnel junction (MTJ) is a multilayer magnetic structure and includes at least three layers: two ferromagnetic layers and a thin layer of a non-magnetic insulator as a barrier layer between the two ferromagnetic layers. The insulator for the middle barrier layer is not electrically conducting and hence functions as a barrier between the two ferromagnetic layers. However, when the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer. Notably, the resistance to the electrical current across the MTJ structure varies with the relative direction of the magnetizations in the two ferromagnetic layers. When the magnetizations of the two ferromagnetic layers are parallel to each other, the resistance across the MTJ structure is at a minimum value $R_p$. When the magnetizations of the two ferromagnetic layers are anti-parallel with each other, the resistance across the MTJ is at a maximum value $R_{AP}$. The magnitude of this effect is commonly characterized by the tunneling magnetoresistance (TMR) defined as $(R_{AP}-R_p)/R_p$.

The relationship between the resistance to the current flowing across the MTJ and the relative magnetic direction between the two ferromagnetic layers in the TMR effect may be applied to various applications, including magnetic memory devices and sensor applications. MTJ structures as memory devices store information in the magnetic state of the MTJ and thus are nonvolatile by retaining the stored information when the electrical power is turned off. Magnetoresistive random access memory (MRAM) devices based on the TMR effect, for example, may be an alternative of and compete with electronic RAM devices. For sensing applications, MTJ structures with large TMR values may be used in magnetic read heads to achieve sensitive and high-speed readout of the stored bits and may also be used in various sensor devices.

SUMMARY

This application describes magnetic or magnetoresistive tunnel junctions (MTJs) having diffusion stop layers to eliminate or reduce diffusion of oxygen, nitrogen or other particles from the barrier layer to the ferromagnetic layers during the film deposition process including the barrier oxidation or nitridation process and the post annealing process. Such MTJs may be used in various applications including magnetic memory (MRAM) devices and magnetic recording heads.

In one exemplary implementation, a device is described to include a substrate, first and second ferromagnetic layers formed over the substrate, and an insulator barrier layer formed between the first and second ferromagnetic layers. The insulator barrier layer is to effectuate tunneling of electrons between the first and second ferromagnetic layers under a bias voltage applied between the first and second ferromagnetic layers and across the insulator barrier layer. This device further includes a diffusion stop layer formed between the first ferromagnetic layer and the insulator barrier layer to permit the tunneling but prevent diffusion of particles from the insulator barrier layer into the first ferromagnetic layer. The diffusion stop layer may be an oxide or a nitride.

Other devices are also described. In some implementations, each or one of the two ferromagnetic layers in the above device may be replaced by a ferrimagnetic layer. For example, a device in one implementation includes a substrate, first and second ferrimagnetic layers formed over the substrate, an insulator barrier layer formed between the first and second ferrimagnetic layers to effectuate tunneling of electrons between the first and second ferrimagnetic layers under a bias voltage applied between the first and second ferrimagnetic layers, and a diffusion stop layer formed between the first ferrimagnetic layer and the insulator barrier layer to permit the tunneling but prevent diffusion of particles from the insulator barrier layer into the first ferrimagnetic layer. The first ferrimagnetic layer is located between the substrate and the second ferrimagnetic layer.

In other implementations, each or one of the two ferromagnetic layers in the above device can be replaced by a half-metal layer in a device as described above. For example, a device in one implementation includes a substrate, first and second half-metal magnetic layers formed over the substrate, an insulator barrier layer formed between the first and second half-metal magnetic layers to effectuate tunneling of electrons between the first and second half-metal magnetic layers under a bias voltage applied between the first and second half-metal magnetic layers, and a diffusion stop layer formed between the first half-metal magnetic layer and the insulator barrier layer to permit the tunneling but prevent diffusion of particles from the insulator barrier layer into the first half-metal magnetic layer. The first half-metal magnetic layer is located between the substrate and the second half-metal magnetic layer.

In yet other implementations, a device includes a substrate, first and second magnetic layers formed over the substrate. The first magnetic layer is located between the substrate and the second magnetic layer. This device further includes an insulator barrier layer formed between the first and second magnetic layers to effectuate tunneling of electrons between the first and second magnetic layers under a bias voltage applied between the first and second magnetic layers, and a diffusion stop layer formed between the first magnetic layer and the insulator barrier layer to permit the tunneling but prevent diffusion of particles from the insulator barrier layer into the first magnetic layer. At least one of the first and second magnetic layers of this device may include a combined layer of a ferromagnetic and a ferrimagnetic layer in one implementation, a combined layer of a ferromagnetic and a half-metal layer in another implementation, two sublayers of ferromagnetic or ferrimagnetic or half-metal magnetic materials and a spacer between the two sublayers in yet another implementation.

Various fabrication methods are also described. For example, a method is described to include the following. A first ferromagnetic layer is fabricated over a substrate. A layer of a first metal as a diffusion stop layer is formed on the first ferromagnetic layer, where the first metal reacts and bonds with oxygen. A layer of a second metal as a barrier layer is formed on the diffusion stop layer, where the second metal reacts and bonds with oxygen. Subsequently, the second metal layer is oxidized into an insulator barrier layer. The first metal in the diffusion stop layer reacts with oxygen to block the oxygen and other particles from diffusing into the first ferromagnetic layer. Next, a second ferromagnetic layer is formed over the insulator barrier layer to form a magnetic tunnel junction in combination with the first ferromagnetic layer and the insulator barrier layer. The magnetic tunnel junction is then annealed during which the diffusion stop layer further prevents diffusion of the oxygen or other particles from the insulator barrier layer into the first ferromagnetic layer.

In some implementations, the above method may further include the following. After the oxidizing and prior to formation of the second ferromagnetic layer, a second diffusion stop layer with the second metal is formed on the insulator carrier layer to further prevent diffusion from the insulator barrier layer into the second ferromagnetic layer during the annealing of the magnetic tunnel junction.

As specific examples for implementing the above methods, the diffusion stop layer may be between 0.5 to 50 angstroms or between 0.5 to 3 angstroms; Aluminum may be used as the second metal and chromium, hafnium, zirconium, tantalum, molybdenum, or titanium may be used as the first metal; and Magnesium may be used as the second metal and chromium, hafnium, zirconium, tantalum, molybdenum or titanium may be used as the first metal.

For another example, a method for fabricating a MTJ with a nitride insulator barrier layer and at least one nitride diffusion stop layer is also described. A first ferromagnetic layer is fabricated over a substrate. A layer of a first metal as a diffusion stop layer is formed on the first ferromagnetic layer, where the first metal reacts and bonds with nitrogen. Next, a layer of a second metal as a barrier layer is formed on the diffusion stop layer, where the second metal reacts and bonds with nitrogen. Subsequently, a nitridation process is applied to change the second metal layer into a nitride insulator barrier layer, where the first metal in the diffusion stop layer reacts with nitrogen to block the nitrogen and other particles from diffusing into the first ferromagnetic layer. A second ferromagnetic layer is then formed over the insulator barrier layer to form a magnetic tunnel junction in combination with the first ferromagnetic layer and the insulator barrier layer. The magnetic tunnel junction is annealed and during the annealing process the diffusion stop layer further prevents diffusion of the nitrogen and other particles from the insulator barrier layer into the first ferromagnetic layer.

As an option in the above methods, after the oxidation or nitridation process and prior to formation of the second ferromagnetic layer, a second diffusion stop layer may be further formed on the insulator barrier layer to further prevent diffusion from the insulator barrier layer into the second ferromagnetic layer during the annealing of the magnetic tunnel junction. This second diffusion stop layer may be formed from the first metal or a different metal. In addition, at least one of the first and second ferromagnetic layers in the above methods may be a magnetic layer which may be implemented as a ferrimagnetic layer, a half-metal magnetic layer, a combined layer of a ferromagnetic and a ferrimagnetic layer, a combined layer of a ferromagnetic and a half-metal layer, or two sublayers of ferromagnetic or ferrimagnetic or half-metal magnetic materials and a spacer between the two sublayers.

These and other implementations, their variations and modifications are described in greater detail in the attached drawings, the detailed description, and the claims.

DETAILED DESCRIPTION

Figure 1:
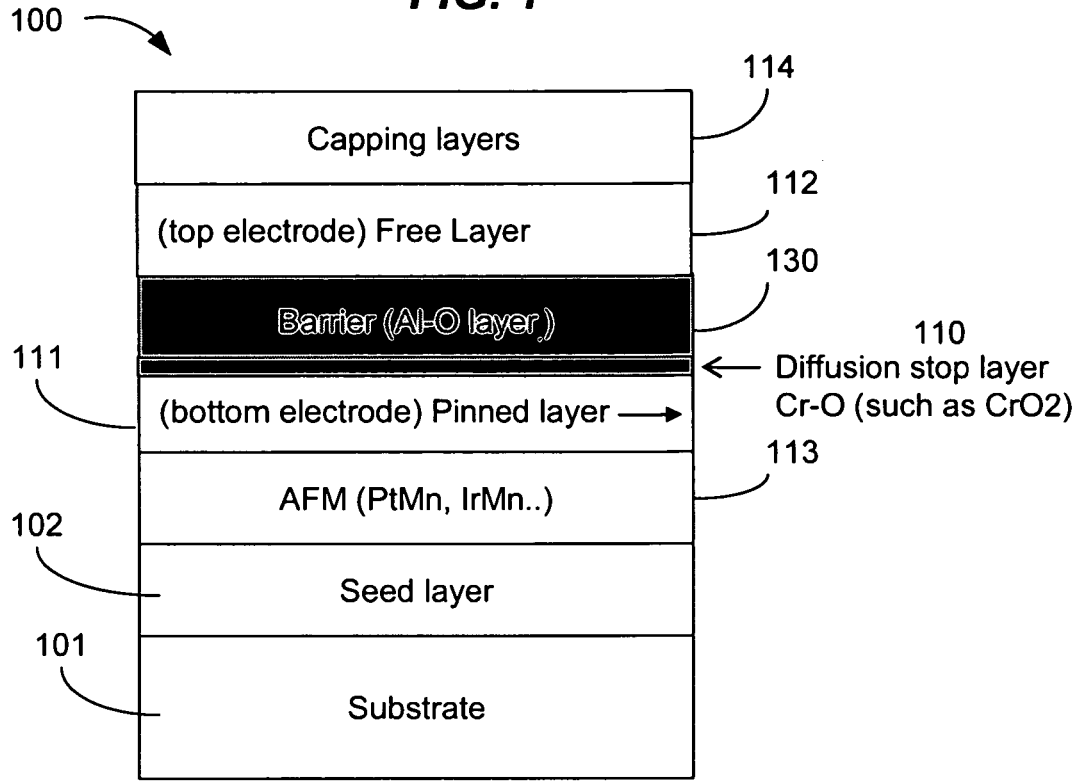
FIGS. 1 and 2 show two examples of MTJs with diffusion stop layers.

A magnetic tunnel junction may be configured to achieve a large magnetoresistance, e.g., up to or greater than 270% at the room temperature and a wide tunable specified resistance or resistance-area product (RA) range, e.g., from 0.1 $\Omega\mu m^2$ to $k\Omega\mu^2$ for various applications such as magnetic memory (MRAM) and magnetic recording heads. For example, a MRAM in a field-based cross point write scheme which uses at least an external writing magnetic field generated by at least a writing current to write a bit may require a RA in the order of few $k\Omega\mu m^2$. A MRAM in a spin transfer switching write scheme which uses the current across the MTJ to write a bit may require the RA on the order of dozens of $\Omega\mu m^2$. In some magnetic recording head applications, the RA of MTJ may be in the range of 0.1-3 $\Omega\mu m^2$.

The tunnel barrier layer and the interface structures between the barrier and the two ferromagnetic layers in a MTJ can significantly affect the TMR ratio, the RA values and the MTJ breakdown voltage in the device applications. Many high magnetic performance MTJs use a thin aluminum or magnesium oxide layer as the tunnel barrier layer in which the aluminum Al or magnesium Mg is oxidized to form a bond of Al—O or Mg—O. In some cases, this bond may be $Al_2O_3$ or MgO. In implementing the MTJs described in this application with the one or more diffusion stop layers, this thin tunnel barrier layer may use metals other than aluminum and magnesium to form the oxidized insulator layers, including but not limited to, Zr—O, Hf—O, and Ta—O. For example, a thin $Al_2O_3$ or more generally Al—O barrier layer may be formed by first depositing a thin Al metal layer with a thickness from, e.g., 4-15 Å, and subsequently oxidizing the deposited thin Al layer in a vacuum system. For MTJs with high RA values (e.g., 0.05-50 $k\Omega\mu m^2$), different plasma oxidation techniques such as microwave-generated plasma have been used for forming $Al_2O_3$ barriers. Low-energy natural oxidation may be used to form MTJs with low RA values (e.g., 0.1-50 $\Omega\mu m^2$).

The thin tunnel barrier should be smooth and homogenous in order to achieve a high TMR, the desired RA value, and a high breakdown voltage. The fabrication of such a barrier layer can be technically challenging in part because a tight uniformity of the layer across a large area of the wafers, e.g., from 200 to 300 mm in diameter for wafers currently in use, is needed during the fabrication process and in part because oxygen may contaminate the ferromagnetic layer under the thin barrier layer during the oxidation process and in the subsequent annealing process. The diffusion stop layer described here is designed to eliminate or substantially minimize diffusion of oxygen and other particles into the ferromagnetic layer and thus the associated contamination to the ferromagnetic layer.

The present use of one or more diffusion stop layers in MTJs is in part based on the recognition of several technical issues in controlling the oxidation process in forming the thin barrier layer between two ferromagnetic layers. The thin barrier layer is an insulator between the two ferromagnetic layers and functions as a barrier to electrons. In existing MTJ fabrication techniques, the thin barrier layer is fabricated from an initial metal layer such as aluminum. Therefore, the initial metal layer need be completely oxidized into an oxide layer as the thin insulator barrier layer. This usually requires heavy oxidation. In addition, complete oxidation and over oxidation of the aluminum layer can suppress pinholes or other defects in the final oxidized layer. This effect of the oxidation is desirable because pinholes or other defects in the final oxidized layer can also reduce the TMR of the MTJ, the RA value and the breakdown voltage. In low-RA MTJ with RA values of 0.1-30 $\Omega\mu m^2$, many studies suggest that the breakdown mechanism in ultra thin alumina barrier is often dominated by extrinsic breakdown related to pinholes and defects in the barrier rather than the failure of the oxide integrity. For the above reasons, under-oxidation of the Al layer is not desirable.

One of the consequences of the heavy oxidation is that excessive oxygen can pass through initial thin metal layer (e.g., Al) or the later oxidized layer (e.g., Al—O) and thus reach the underlying ferromagnetic layer which is formed prior to formation of the metal layer and the oxidation process. This presence of oxygen in the ferromagnetic layer underneath the Al layer is a contamination to the ferromagnetic layer and can degrade the MTJ. Oxidized ferromagnetic free layer (FL) and pinned layer (PL) in MTJs can adversely affect the performance of MTJs such as reduced TMR values.

In fabrication, it can be difficult to choose and control the proper Al oxidation condition in forming the Al—O barrier layer such that the Al layer is completely oxidized with minimum pinholes and defects and yet the oxidation is not excessive to cause penetration of oxygen into the underlying ferromagnetic layer. The proper control of the degree of oxidation becomes even more difficult in making MTJs with low RA values (e.g., 0.1-50 $\Omega\mu m^2$) because the barrier layer (e.g., $Al_2O_3$) may have to be very thin on the order of several angstroms (e.g., 3-7 Å) in some designs and oxygen can relatively easily pass through the thin layer to reach the underlying ferromagnetic layer during the oxidation process.

Oxygen contamination of the underlying ferromagnetic layer during the oxidation process is, however, only part of the overall oxygen contamination problem and additional contamination can occur in the subsequent post annealing process. In MTJs, one of the two ferromagnetic layers on two sides of the insulator barrier layer is a magnetically pinned layer by another immediate adjacent antiferromagnet (AFM) layer which may be, e.g., PtMn. During the fabrication, after the ferromagnetic layer and the immediate adjacent antiferromagnetic layer are formed, the ferromagnetic layer is not pinned when the AFM material is PtMn. The pinning of the ferromagnetic layer by PtMn occurs during the post-processing annealing process which is carried out at an elevated temperature in vacuum, e.g., at 200° C. to 300° C. When other AFM materials such as IrMn are used for pining, the pinning is established during the film deposition process and is further improved by the post annealing process. The post annealing is also conducted in the backend packaging process in memory fabrication. Unfortunately, during this post annealing process, the oxygen in the oxidized barrier layer such as the excessive oxygen can diffuse into the bottom and top ferromagnetic layers (which may also function as electrodes) and therefore further degrade the performance of the MTJs.

The use of one or more diffusion stop layers described in this application can be used to provide a reliable and controllable oxidation process for forming high-quality thin oxidation barrier in a MTJ element having a high TMR, a designed RA value, a high intrinsic dominated breakdown voltage ($V_{bd}$) and their tight or uniform spatial distributions across a large-size wafer on which on or more MTJs are fabricated. Notably, the diffusion stop layer can address the oxygen contamination in both the oxidation process and the post annealing process.

FIG. 1 illustrates one example of a MTJ 100 having a diffusion stop layer 110. The MTJ 100 is constructed on one or more seed layers 102 directly formed on the substrate 101. On the seed layers 102, an antiferromagnetic layer 113 is first formed and then a first ferromagnetic layer 111 is formed on top of the AFM layer 113. After the post annealing, the ferromagnetic layer 111 later is pinned with a fixed magnetization. In some implementations, this fixed magnetization may be parallel to the substrate 101 (i.e., the substrate surface). On top of the first ferromagnetic layer 111 is the diffusion stop layer 110 which, as initially deposited during the fabrication, is a metal layer made of a selected metal that reacts or bonds with oxygen to form an oxide to block further migration or diffusion of oxygen. The transition metal Chromium (Cr), for example, can be used to effectively stop oxygen by reacting and bonding with oxygen to form an oxide Cr—O. Other transition metals may also be used, including but not limited to hafnium (Hf), zirconium (Zr), tantalum (Ta) and molybdenum (Mo) and titanium (Ti). Examples of the oxides of these metals may include, among others, $Ta_2O_5$, $SiO_2$, $HfO_2$, TiOx, MgO and $ZrO_2$. A thin insulator barrier layer 130 such as a metal oxide layer is formed on top of the diffusion stop layer 110. The metal for forming the insulator barrier layer 130 may be, for example, aluminum (Al), hafnium (Hf), zirconium (Zr), tantalum (Ta) and magnesium (Mg).

In addition, various nitride layers based on different metals may be used to implement the insulator barrier layer 130. As an example, an aluminum nitride layer such as AlN can be the thin tunnel barrier layer 130. A thin aluminum layer may be first formed and a nitridation process is performed to change aluminum layer into the AlN layer as opposed to an oxidation process for oxidizing the aluminum layer when Al—O is used as the thin tunnel barrier layer. Similar to oxygen, nitrogen can also contaminate the ferromagnetic layers. In MTJs where a nitride layer is used as the barrier layer, a diffusion stop layer is formed between the barrier layer and the ferromagnetic layer to prevent diffusion of the nitrogen from the barrier layer to a ferromagnetic layer, thus eliminating or reducing the nitrogen contamination in MTJs. Other nitride materials may also be used for the insulator barrier layer 130 and such examples include a Ti nitride (e.g., TiN), an AlTi nitride (e.g., TiAlN) and a magnesium nitride. Examples of the diffusion stop layer include a chromium nitride (e.g., CrNx), a vanadium nitride (e.g., VNx), an iron nitride (e.g., FeNx), and a titanium nitride (e.g., TiNx) which may be formed by first depositing a metal layer (Cr, V, Fe, Ti, etc.) and then applying a nitridation process to turn the metal layer into a nitride layer as the diffusion stop layer. The examples of MTJ structures with oxide insulator barrier layers and their fabrication process can be similarly applied to the MTJ structures with nitride insulator barriers.

Notably, the diffusion stop layer 110 separates the barrier layer 130 and the underlying ferromagnetic layer 111 from each other and thus prevents oxygen or nitrogen from entering the ferromagnetic layer 111. In the illustrated example, the diffusion stop layer 110 is deposited as a metal layer prior to the formation of the oxide barrier layer 130 and before the oxidation process. Therefore, during the oxidation, the diffusion stop layer 110 can protect the underlying ferromagnetic layer 111 from oxygen. After the diffusion stop layer 110 is in place, it operates to prevent diffusion of oxygen and other particles from the barrier layer 130 in any of the subsequent processes including the post annealing process.

In the MTJ 100, a second ferromagnetic layer 112 is formed directly on top of the barrier layer 130 without any diffusion stop layer in between. The magnetization of this ferromagnetic layer 112 is not pinned and can be freely changed to be parallel to or anti parallel to the fixed magnetization of the pinned layer 111 under a control of either an external control magnetic field or a driving current perpendicularly flowing through the MTJ. For this reason, the layer 112 is a free layer (FL). A magnetic field in the field operating range, or an applied current across the junction in the current operating range, can force the magnetization of the free layer 112 to be substantially parallel to or substantially opposite to the fixed magnetization of the pinned layer 111. Many magnetic systems have competing energy contributions that prevent a perfect parallel or antiparallel alignment of the magnetic domains or nanomagnets in each ferromagnetic layer. In MTJs, the dominant contribution to the energy state of the nanomagnets within the free layer 112 tends to force the nanomagnets into the parallel or antiparallel alignment, thus producing substantial parallel or antiparallel alignment. Because the second ferromagnetic layer 112 is deposited after the oxidation process for forming the oxide barrier layer 130, the second ferromagnetic layer 112 is not directly contaminated by the oxidation process but can nevertheless be exposed to oxygen diffused from the oxide barrier layer 130 during the post annealing process. If, however, the excessive oxygen in the oxide barrier layer is controlled at a minimum, the oxygen contamination caused by diffusion of oxygen to the first and second ferromagnetic layers 111 and 112 during the post annealing process can be minimized to a degree that the degradation effect due to the oxygen diffusion in the post annealing process is insignificant.

Figure 2:
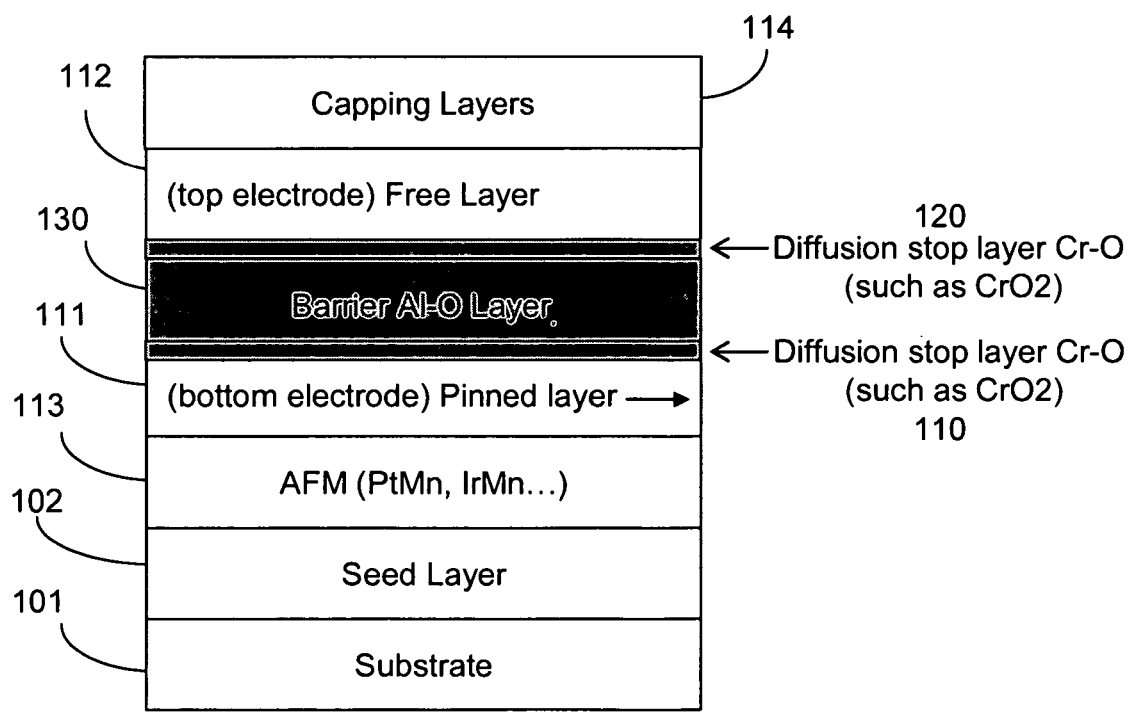

As an option to further prevent any oxygen contamination to the second ferromagnetic layer 112 during the post annealing process, a second diffusion layer 120 may be formed between the oxide barrier layer 130 and the second ferromagnetic layer 112. FIG. 2 shows an example of a MTJ with two diffusion stop layers 110 and 120 on both sides of the barrier layer 130. In this design, a thin oxidation (or nitridation) diffusion stop layer is placed at both side of the Al-based barrier layer 130 so that oxygen cannot diffuse into the FL and PL layers 112 and 111 during oxidation process of the Al layer 130 and/or in post anneal processes. Oxidation is thus confined within the barrier layer 130 during the film deposition process and the post annealing process (AFM anneal and backend MRAM processes) because of the presence of the CrO diffusion stop layers 110 and 120.

In both MTJs in FIGS. 1 and 2, one or more capping layers 114 can be formed on top of the second ferromagnetic layer 112 to protect the MTJ. Each of the layers 111, 112 and 114 may have a multilayer structure to include two or more sublayers.

In both designs in FIGS. 1 and 2, the Al layer 130 can be fully (heavily) oxidized in the oxidation process in order to suppress pinholes and other defects without oxidizing the bottom ferromagnetic layer 111 (also as an electrode) underneath the Al layer 130 in the heavy oxidation process.

Each diffusion stop layer 110 or 120 in FIGS. 1 and 2 is an extra layer in the classic three-layer designs for MTJs. In this context, the MTJs deviate from many known three-layer MTJ structures. In MTJs, one of the two ferromagnetic layers on two sides of the insulator barrier layer is a magnetically pinned layer by another immediate adjacent antiferromagnetic (AFM) layer (e.g., AFM pining in case of PtMn). In various implementations, each diffusion stop layer may be designed to be thin, e.g., between 0.5 to 50 angstroms or between 0.5 to a few angstroms such as 3 angstroms, so that the thickness of the diffusion stop layer is sufficiently thick to stop the oxygen or nitrogen contamination during the deposition process and the post annealing process but sufficiently thin to construct a high-performance MTJ.

Figure 3A:
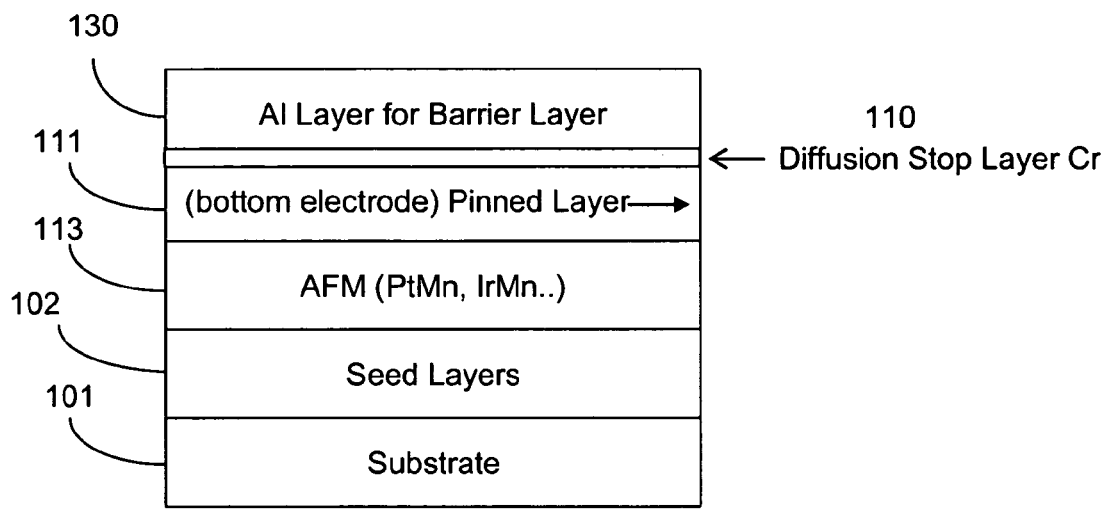
FIGS. 3A, 3B and 3C illustrate one example of a processing flow for fabricating the MTJ in FIG. 1.
Figure 3B:
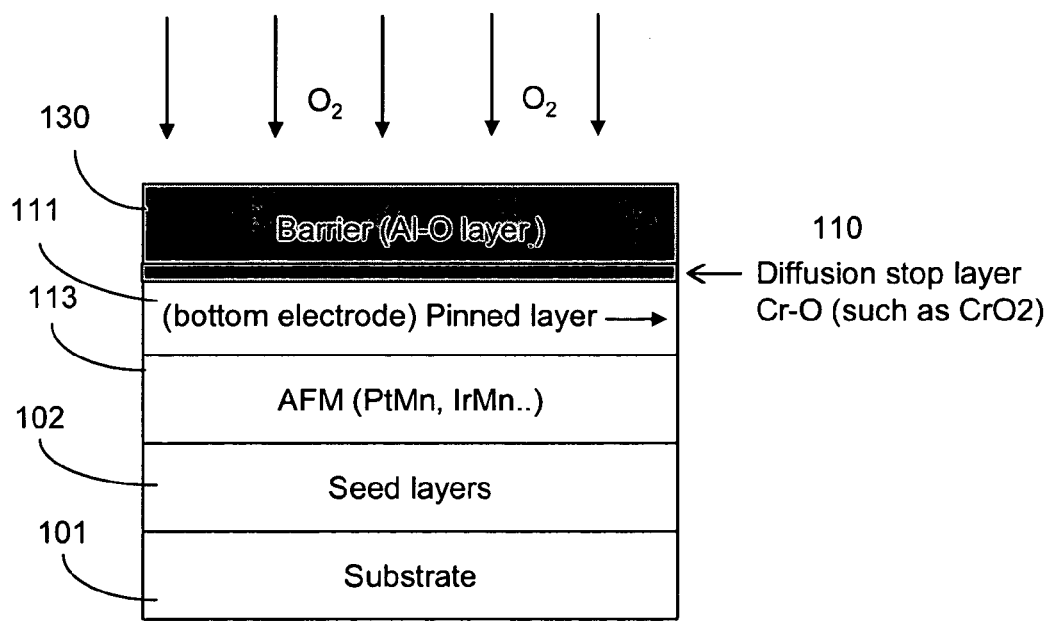
Figure 3C:
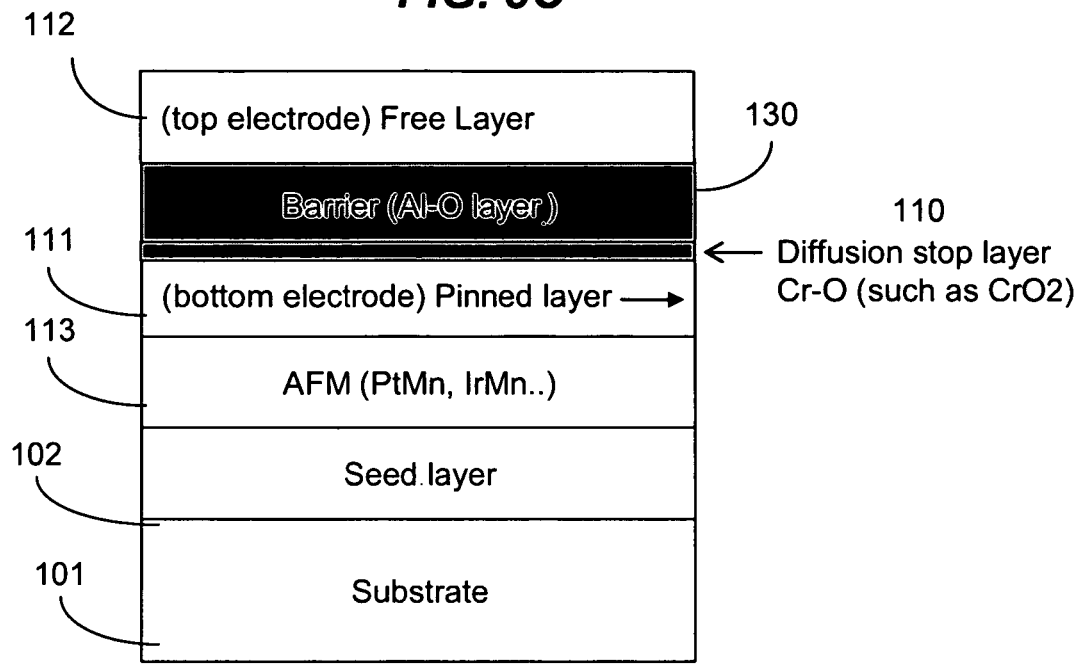

FIGS. 3A, 3B and 3C illustrate an example of the fabrication process for the MTJ in FIG. 1. First, the substrate 101 is prepared. The seed layer 102, AFM layer 113 and the first ferromagnetic layer 111 are sequentially deposited on the substrate 101. This completes fabrication of the first ferromagnetic layer 111 over the substrate 101. A selected first metal for the diffusion stop layer 110 (e.g., Cr) is then deposited on top of the ferromagnetic layer 111. Next, a layer of a selected second metal is deposited on the diffusion stop layer 110 as the barrier layer 130. At end of this step, the structure is shown in FIG. 3A.

FIG. 3B shows the subsequent oxidation of the second metal layer 130 into the final insulator barrier layer. During this process, the first metal in the diffusion stop layer 110 reacts with oxygen passing through the first metal layer or the oxidized insulator barrier layer 110 to block the oxygen and other particles from diffusing into the first ferromagnetic layer 111. Heavy oxidation can be performed here to ensure complete oxidation of the layer 130 and to reduce or minimize the pinholes and defects in the oxidized layer 130. This oxidation process may be implemented with various oxidation processes, including plasma oxidation methods, natural oxidation methods such as oxidation in a controlled oxygen pressure, ion-beam oxidation methods, oxidation by glow-discharge plasma, atomic-oxygen exposure, and ultraviolet-stimulated oxygen exposure.

After the oxidation, the second ferromagnetic layer 112 is formed over the insulator barrier layer 130 to form a magnetic tunnel junction between the first and the second ferromagnetic layers 111 and 112 (FIG. 3C). Capping layers 114 are then deposited to complete the film deposition process as shown in FIG. 1. The magnetic tunnel junction is then annealed during which the diffusion stop layer 110 prevents diffusion from the insulator barrier layer 130 into the first ferromagnetic layer 111.

The MTJ in FIG. 2 can be similarly fabricated with an additional step of forming the second diffusion stop layer 120 before forming the second ferromagnetic layer 112.

Figure 4:
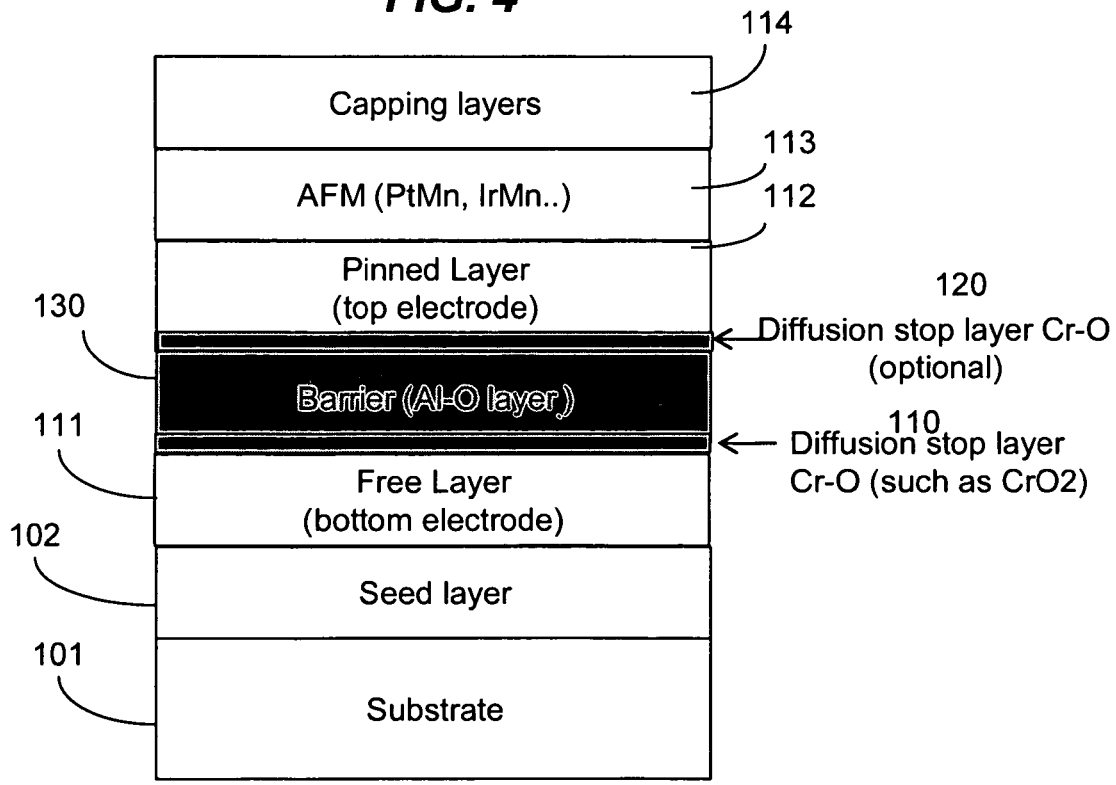
FIGS. 4, 5 and 6 show three examples of magnetic structures that use MTJs with diffusion stop layers.

The examples in FIGS. 1 and 2 place the pinned ferromagnetic layer 111 between the barrier layer 130 and the substrate 101 in a "bottom MTJ" configuration. Alternatively, the free layer 112 may be placed under the barrier layer 130 and above the substrate 101 in a "top MTJ" configuration as shown in FIG. 4 with two diffusion stop layers 110 and 120. In MTJs, one of the two ferromagnetic layers on two sides of the insulator barrier layer 130 is a magnetically pinned layer by another immediate adjacent antiferromagnetic (AFM) layer (e.g., AFM pining in case of PtMn) on the top of the pinned ferromagnetic layer. A top MTJ may also be designed with only the lower diffusion stop layer between the free layer and the barrier layer without the second diffusion stop layer. The above MTJs with one or more diffusion stop layers can be operated by both field and spin-transfer switching write operations.

Figure 5:
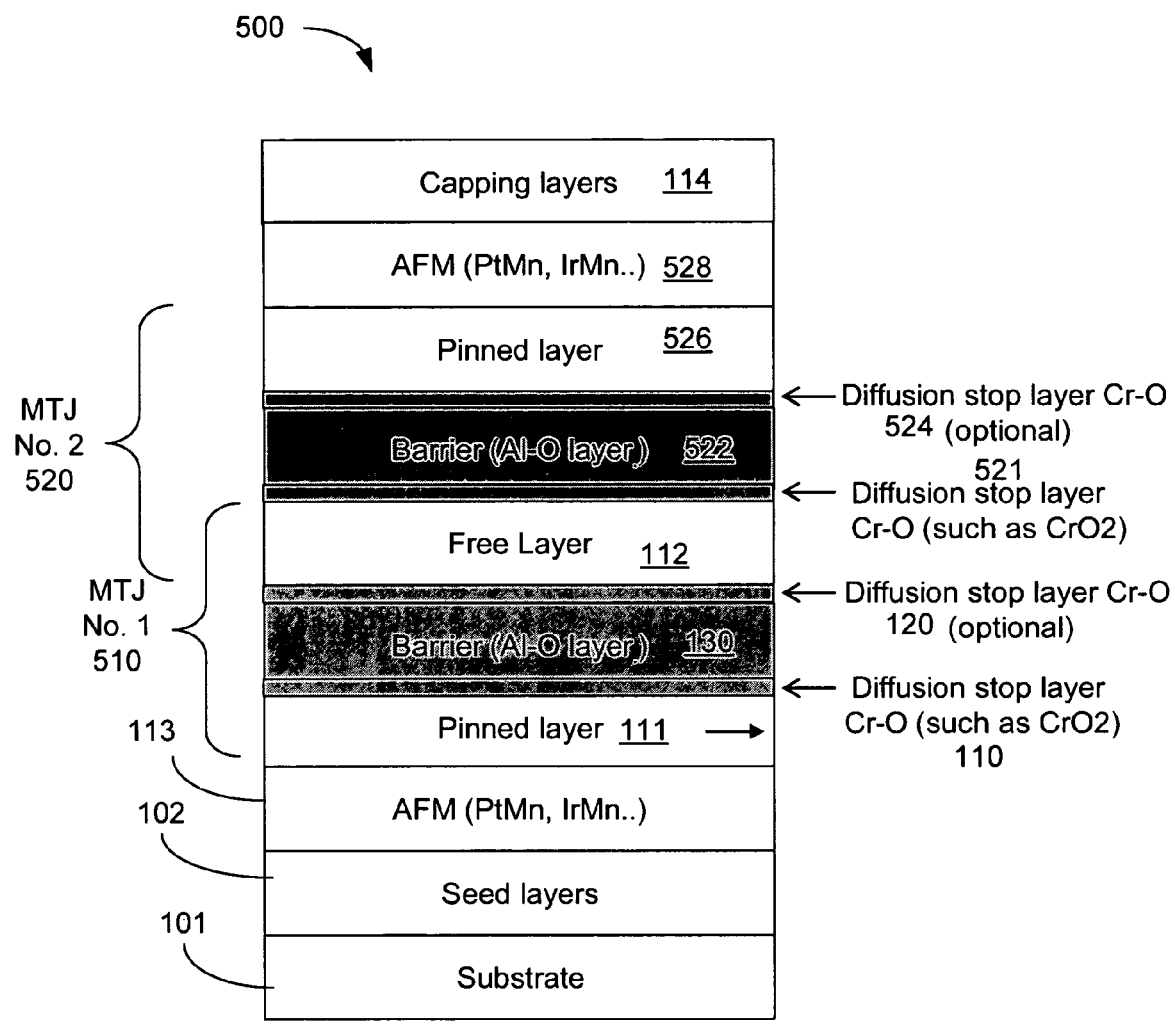
Figure 6:
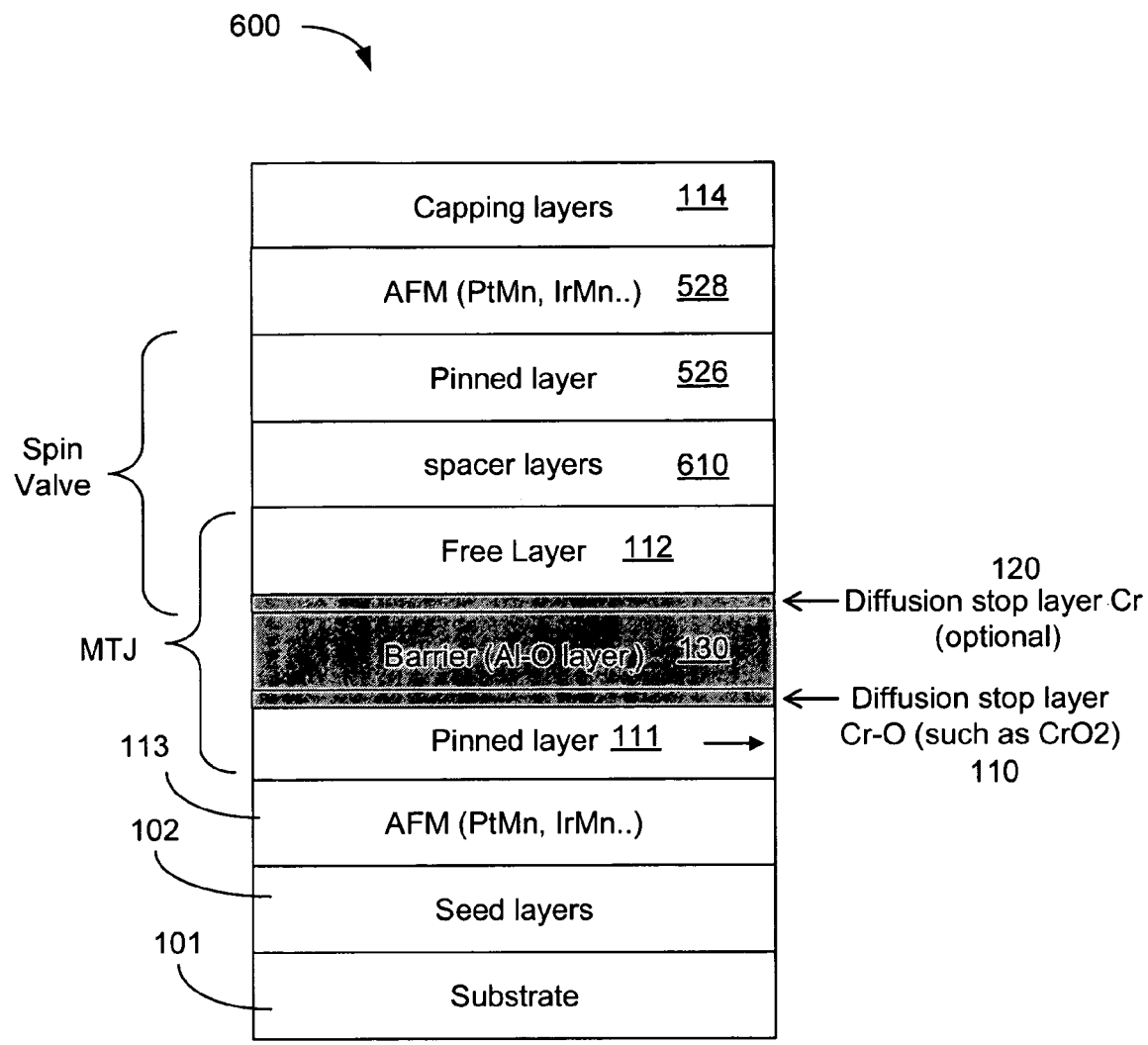

More complex structures may be constructed based on the above MTJs with one or more diffusion stop layers. FIGS. 5 and 6 show two examples.

FIG. 5 shows a dual MTJ structure 500 where two MTJs 510 and 520 are stacked over each other and share a common free layer 112 made of a ferromagnetic material based on the "bottom MTJ" configuration in FIG. 2. Alternatively, a dual MTJ may also be constructed based on the "top MTJ" configuration as shown in FIG. 4. As illustrated, on top of the free layer 112, a third diffusion stop layer 521 and a second barrier layer 522 are formed. A second pinned layer 526 and a second antiferromagnetic layer 528 are formed over the barrier layer 522 to complete the second MTJ 520. A fourth diffusion stop layer 524 may be formed between the second barrier layer 522 and the second pinned layer 526. The capping layers 114 may be formed at the top of the dual structure. Similar to a single MTJ structure, the electrical current is directed perpendicular to the layers through the two MTJs 510 and 520. This design effectuates a serial connection of two resistors. This structure can be operated by both field and spin-transfer switching write operations. In some implementations, the pinned layers 526 and 111 may have pinned magnetizations that substantially anti parallel to each other so that the switching current density is small to achieve good spin-transfer switching writing operation.

FIG. 6 shows a hybrid structure 600 which stacks a spin valve over a MTJ based on the top MTJ configuration in FIG. 2. Alternatively, the bottom MTJ configuration in FIG. 4 may be used for this hybrid structure. The spin value and the MTJ share the free layer 112 over the barrier layer 130 of the MTJ. The spin valve includes the shared ferromagnetic free layer 112, one or more nonmagnetic and electrically conductive spacer layers 610 (e.g., metal layers) and a pinned ferromagnetic layer 526, wherein the first and third ferromagnetic layers 111 and 526 are pinned layers by the two antiferromagnetic (AFM) layers 113 and 528 on the bottom and the top of the stack(e.g., AFM pining in case of PtMn), respectively. The MTJ has the diffusion stop layer 110 separating the barrier layer 130 and the first ferromagnetic layer 111. The optional second diffusion stop layer 120 between the free layer 112 and the barrier layer 120 is also shown but may be omitted in other implementations. This hybrid structure 600 can be operated by the spin-transfer switching operation where the driving current perpendicularly flowing through the structure controls the spin value to change the direction of the magnetization of the free layer. The driving current, in turn, controls the magnetoresistance across the MTJ via control of the free layer.

Some implementations of field and spin-transfer switching write operations have been described in the literature. See, for example, U.S. Pat. Nos. 6,829,161 and 6,847,547 issued to Yiming Huai et al., the entire disclosures of which are incorporated herein by reference as part of the specification of this application. In the field write operations, an external magnetic field generated by currents driven through the bit line and the write line for each cell is used to switch the magnetization of the free layer in the MTJ of the cell.

Figure 7:
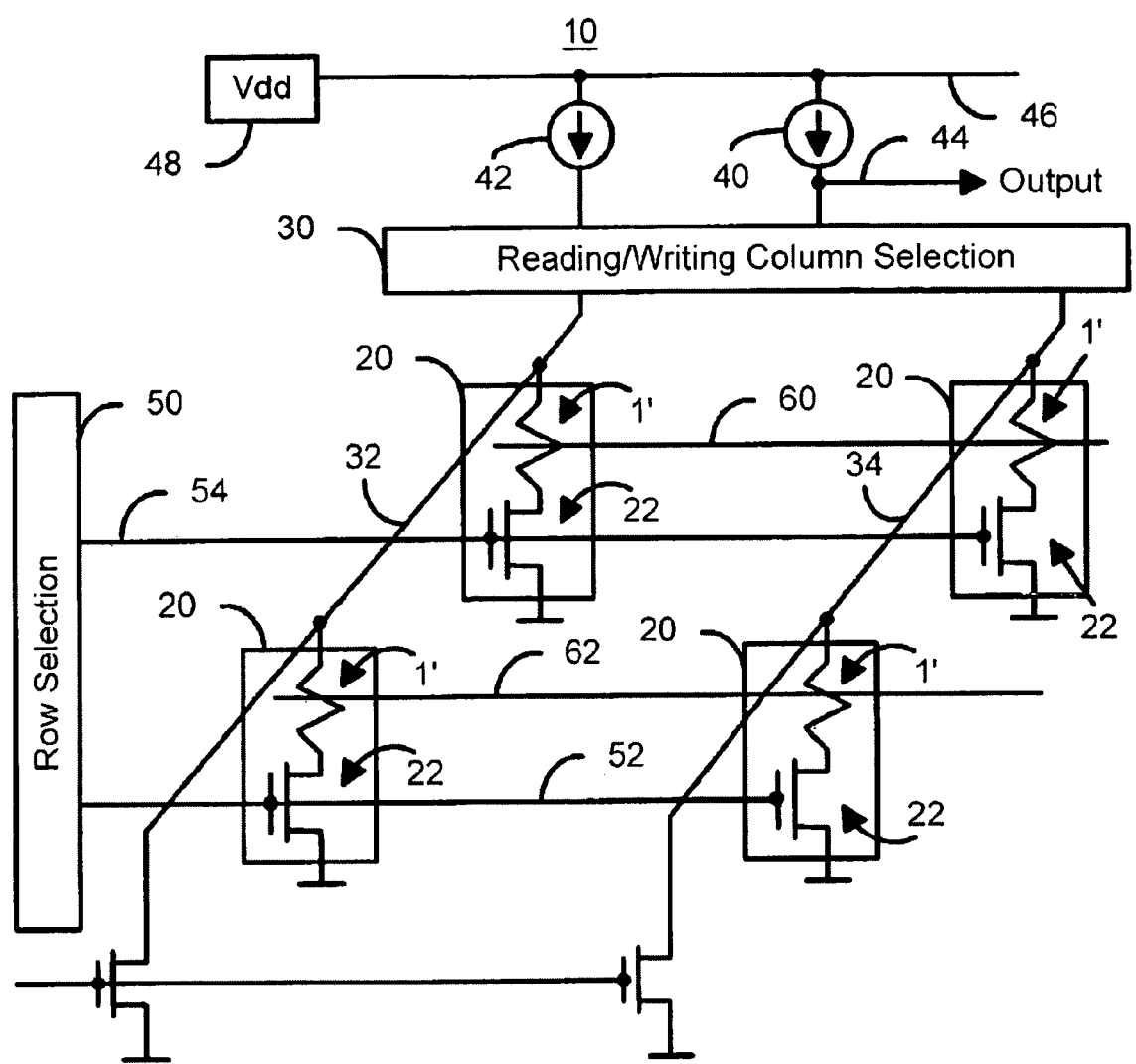
FIGS. 7 and 8 show two MRAM arrays with two different write modes where MRAM cells have MTJs with diffusion stop layers.

FIG. 7 shows an example of an MRAM array device 10 with multiple MRAM cells 20 based on above MTJ structures each with one or more diffusion stop layers in a field write configuration. Each memory cell 20 includes a MTJ element 1' described above for the field write operation. Each memory cell 20 further includes a transistor 22 and is coupled to reading/writing column selection 30 via bit lines 32 and 34 and to row selection 50 via word lines 52 and 54. Also depicted are write lines 60 and 62 which carry currents that generate external magnetic fields for the corresponding conventional memory cells 20 during writing. The reading/writing column selection 30 is coupled to write current source 42 and read current source 40 which are coupled to a voltage supply Vdd 48 via line 46.

In writing to the memory array 10, the write current Iw 42 is applied to the bit line 32 or 34 selected by the reading/writing column selection 30. The read current Ir 40 is not applied. Both word lines 52 and 54 are disabled. The transistors 22 in all memory cells are disabled. In addition, one of the write lines 60 and 62 selected carries a current used to write to the selected conventional memory cell 20. The combination of the current in the write line 60 or 62 and the current in the bit line 32 or 34 generates a magnetic field large enough to switch the direction of magnetization of the free layer in the MTJ of the selected cell 20 and thus write to the selected cell 20. Depending upon the data written to the memory cell 20, the magnetic tunneling junction can exhibit either a high resistance or a low resistance. When reading from a cell 20, the read current Ir 40 is applied instead. The memory cell 20 selected to be read is determined by the row selection 50 and column selection 30. The output voltage is read at the output line 44.

Figure 8:
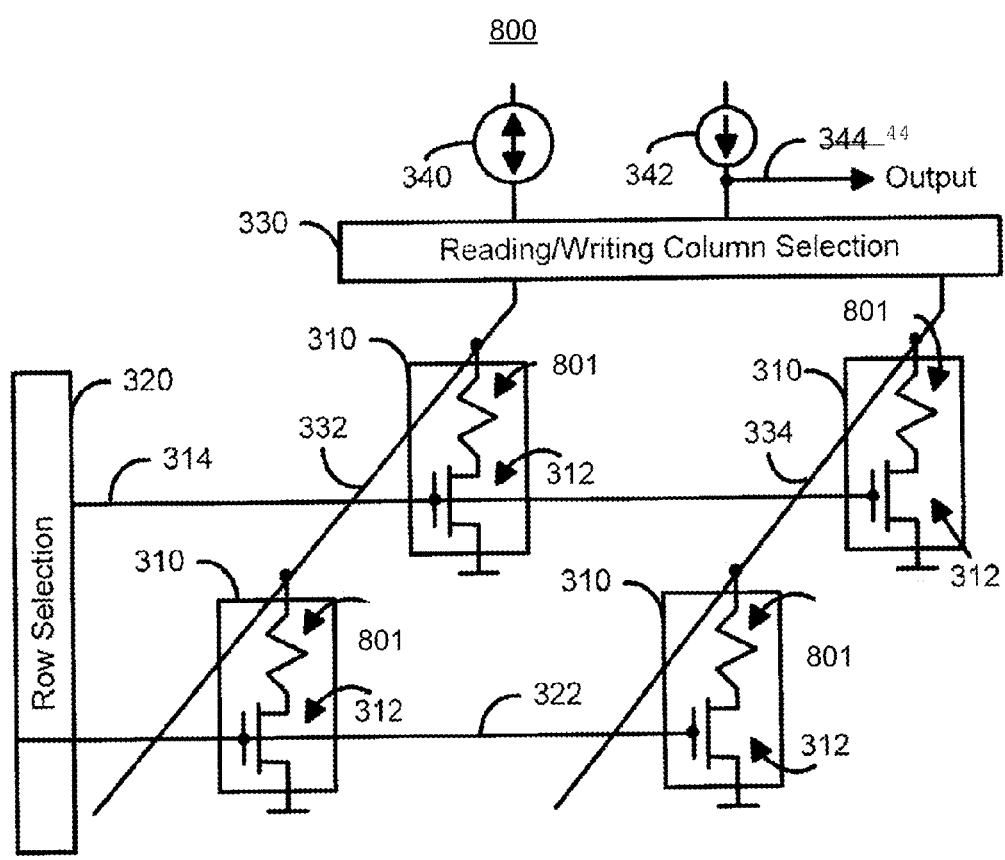

FIG. 8 shows an example of an MRAM array device 800 with multiple MRAM cells 310 based on above MTJ structures with one or more diffusion stop layers in a spin-transfer switching write configuration. Each memory cell 310 includes a magnetic element 801 which has at least one MTJ with one or more diffusion stop layers as described above for the spin-transfer switching write operation and a transistor 312 as part of the control for the cell. The magnetic memory array 800 also includes row selection mechanism 320, column selection mechanism 330, word lines 322 and 314, and bit lines 332 and 334. The magnetic memory array 800 further includes a write current source 340 and a read current source 342. Different from the design in FIG. 7, the magnetic memory array 800 does not include any write lines because spin transfer is used to write to the magnetic elements 801 of the cells 310. As such, additional lines, such as write lines 60 and 62 of the memory 10 depicted in FIG. 7, are unnecessary and are eliminated here. Consequently, the density of the magnetic memory 800 may be further increased without high power consumption and other issues due to the use of the field write operation to write the magnetic memory elements 801. In addition, the circuitry used to write to the magnetic memory elements 801 can be simplified because of the omission of separate write lines.

The spin transfer switching in FIG. 8 can be implemented in various configurations. Current knowledge of spin transfer is described in detail in J. C. Slonczewski, "Current-driven Excitation of Magnetic Multilayers," Journal of Magnetism and Magnetic Materials, vol. 159, p. L1-L5 (1996); L. Berger, "Emission of Spin Waves by a Magnetic Multilayer Traversed by a Current," Phys. Rev. B, Vol. 54, p.9353 (1996), and in F. J. Albert, J. A. Katine and R. A. Burhman, "Spin-polarized Current Switching of a Co Thin Film Nanomagnet," Appl. Phys. Lett., vol. 77, No. 23, p.3809-3811 (2000). The spin transfer can be, however, implemented in other configurations beyond the techniques described in the above referenced publications.

Based on the above referenced publications, the spin-transfer effect arises from the spin-dependent electron transport properties of ferromagnetic-normal metal multilayers. When a spin-polarized current traverses a magnetic multilayer structure in a direction perpendicular to the layers, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$-$10^8$ A/cm$^2$), and if the dimensions of the multilayer are small (approximately less than two hundred nanometers) so that effects of the helical magnetic field produced by the perpendicular current are not important. In addition, for spin transfer to be able to switch the magnetization direction of a ferromagnetic layer, the ferromagnetic layer should be sufficiently thin, for instance, preferably less than approximately ten nanometers for Co in some implementations.

The phenomenon of spin transfer can be used as an alternative to or in addition to using an external switching field to switch the direction of magnetization of the free layer in a spin valve or MTJ. Spin transfer can dominate other mechanisms and become observable when the dimensions of the cells are small, e.g., in the range of few hundred nanometers in some implementations. Consequently, spin transfer is suitable for higher density magnetic memories with small cells. A polarized electrical current is directed across the MTJ in a direction perpendicular to the layers of the MTJ to switch the magnetization direction of the free layer of the MTJ via the spin transfer. Thus, the spin transfer can be used to write to magnetic elements in a magnetic memory. Notably, the mechanism of spin-transfer writing is, therefore, more localized and generates less cross talk. When each cell is made sufficiently small, the current required to switch the magnetization of the free layer via spin transfer can be significantly less than the current required to generate a switching magnetic field in FIG. 7, thus reducing the power consumption.

One way of implementing the spin transfer switching operation is to use a spin valve in each cell. One example is illustrated in FIG. 6. The referenced U.S. Pat. Nos. 6,829,161 and 6,847,547 describe additional cell designs with spin valve and MTJ which can also be implemented with the diffusion stop layers described in this application.

Figure 9:
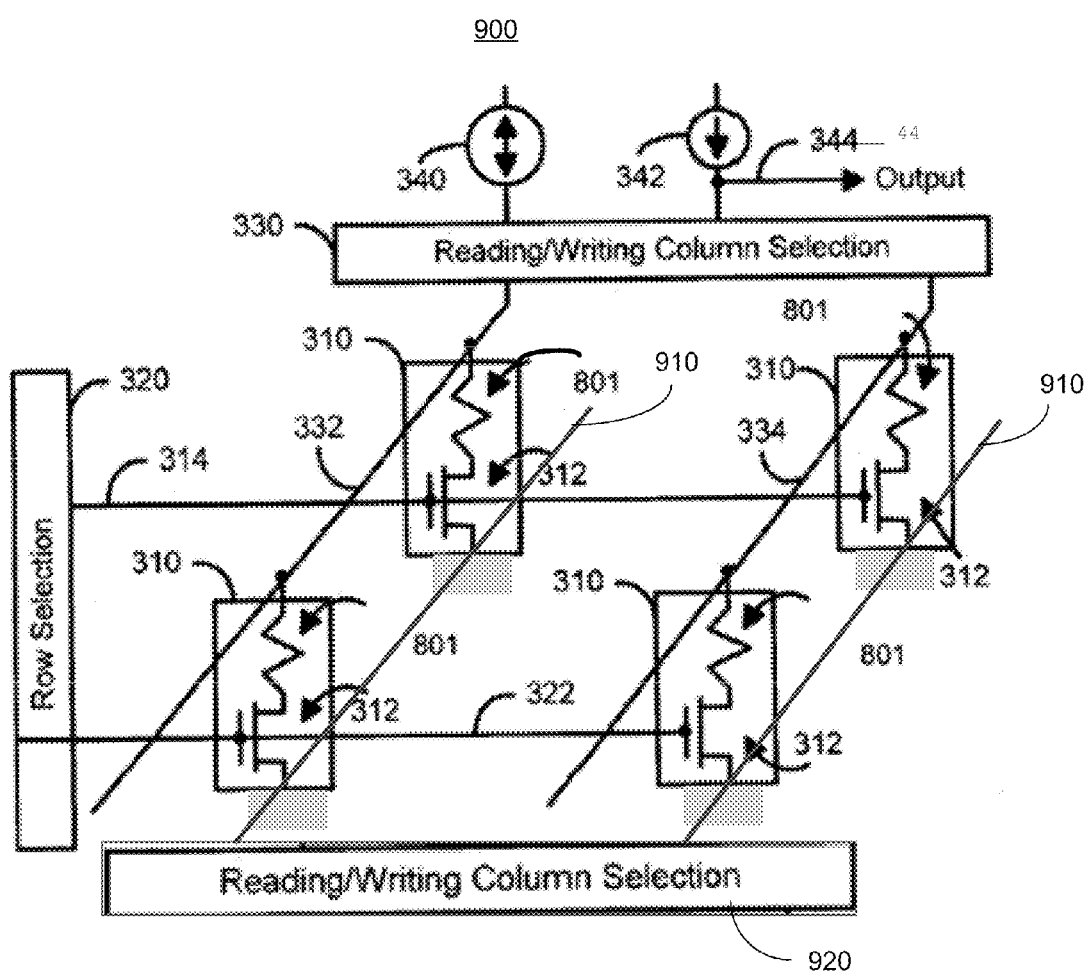
FIG. 9 further shows an alternative implementation of the MRAM in FIG. 8.

FIG. 9 further shows an alternative implementation 900 of the MRAM in FIG. 8 based on the spin-transfer switching operation. In FIG. 8, different control transistors 312 for different cells are connected to a common voltage reference such as the ground as illustrated and each cell is controlled by a single bit line (332, 334, etc.). The design in FIG. 9 uses a second bit line 910 to replace the common voltage reference in FIG. 8 so that the current flowing perpendicularly through the MTJ is controlled by the difference of the bias voltages of the two bit lines for each cell. A second reading/writing column selection 920 is provided to control the voltage on second bit lines 920.

In the above MTJ structures with one or more diffusion stop layers, each or one of the ferromagnetic layers may be replaced by a ferrimagnetic layer which exhibits a smaller net magnetization as compared to a ferromagnetic layer and may be used to reduce spin transfer switching current. In other implementations, each or one of the ferromagnetic layers may be replaced by a half-metal layer which exhibits a high spin polarization that may enhance significantly TMR and spin transfer effect. In addition, each or one of the ferromagnetic layers may be replaced by a combined or a composite layer having, e.g., (1) a ferromagnetic and a ferrimagnetic layer or (2) a ferromagnetic and a half-metal layer. Furthermore, each or one of the ferromagnetic layers may also be replaced by a layer with a synthetic structure of two sublayers out of ferromagnetic or ferrimagnetic or half-metal materials separated by a spacer such as Cu, Cr, Ru, etc. The thickness values of the sublayers may be of equal or different. Examples of half-metallic materials suitable for the above structures include $CrO_2$, $Sr_2FeMoO_6$, $(La_{0.7}Sr_{0.3})MnO_3$, $Fe_3O_4$, and NiMnSb, of which $Fe_3O_4$ has the highest Curie temperature resulting in high spin polarization at the room temperature.

Only a few implementations are disclosed. Variations and enhancements may be made.

What is claimed is:

1. A device, comprising:
a substrate;
first and second magnetic layers formed over the substrate, wherein the first magnetic layer is located between the substrate and the second magnetic layer;
an insulator barrier layer formed between the first and second magnetic layers to effectuate tunneling of electrons between the first and second magnetic layers under a bias voltage applied between the first and second magnetic layers and across the insulator barrier layer;
a diffusion stop layer formed between the first magnetic layer and the insulator barrier layer to permit the tunneling and prevent diffusion of particles from the insulator barrier layer into the first magnetic layer,
wherein the first magnetic layer is a magnetically pinned ferromagnetic layer whose magnetization is fixed in a first direction, and the second magnetic layer is a free ferromagnetic layer whose magnetization is controllable to be either substantially parallel to or substantially opposite to the fixed magnetization of the first ferromagnetic layer;
a second insulator barrier layer formed above the second ferromagnetic layer;
a second diffusion stop layer formed between the second ferromagnetic layer and the second insulator barrier layer to prevent diffusion of particles from the second insulator barrier layer into the second ferromagnetic layer;
a third ferromagnetic layer formed above the second insulator barrier layer and magnetically pinned,
wherein the second insulator barrier layer and the second diffusion stop layer are structured to effectuate tunneling of electrons between the second and the third ferromagnetic layers under a second bias voltage applied between the second and the third ferromagnetic layers; and
a third diffusion stop layer formed between the second ferromagnetic layer and the first insulator barrier layer to permit the tunneling and to prevent diffusion of particles from the first insulator baffler layer into the second ferromagnetic layer.

2. The device as in claim 1, further comprising:
a first antiferromagnetic (AFM) layer next to the first ferromagnetic layer to pin the magnetization of the first ferromagnetic layer; and
a second antiferromagnetic (AFM) layer next to the third ferromagnetic layer to pin the magnetization of the third ferromagnetic layer.

3. The device as in claim 2, wherein the pinned magnetization direction of first ferromagnetic later and the pinned magnetization direction of third ferromagnetic layer are substantially anti parallel to each other.

4. The device as in claim 3, further comprising a current control mechanism to supply and control a variable and polarized current perpendicularly flowing between the first and the third ferromagnetic layers to change the direction of the second magnetization, thus altering a first resistance between the first and the second ferromagnetic layers and a second resistance between the second and the third ferromagnetic layers.

5. The device as in claim 1, further comprising a control mechanism to produce a variable control magnetic field to change the direction of the second magnetization, thus altering a first resistance between the first and the second ferromagnetic layers and a second resistance between the second and the third ferromagnetic layers.

6. The device as in claim 1, further comprising a current control mechanism to supply and control a variable and polarized current perpendicularly flowing between the first and the third ferromagnetic layers to change the direction of the second magnetization, thus altering a first resistance between the first and the second ferromagnetic layers and a second resistance between the second and the third ferromagnetic layers.

7. A device, comprising:
a substrate;
first and second magnetic layers formed over the substrate, wherein the first magnetic layer is located between the substrate and the second magnetic layer;
an insulator barrier layer formed between the first and second magnetic layers to effectuate tunneling of electrons between the first and second magnetic layers under a bias voltage applied between the first and second magnetic layers and across the insulator barrier layer;
a diffusion stop layer formed between the first magnetic layer and the insulator barrier layer to permit the tunneling and prevent diffusion of particles from the insulator barrier layer into the first magnetic layer,
wherein the first magnetic layer is a magnetically pinned ferromagnetic layer whose magnetization is fixed in a first direction, and the second magnetic layer is a free ferromagnetic layer whose magnetization is controllable to be either substantially parallel to or substantially opposite to the fixed magnetization of the first ferromagnetic layer;
a second insulator barrier layer formed above the second ferromagnetic layer;
a second diffusion stop layer formed between the second ferromagnetic layer and the second insulator barrier layer to prevent diffusion of particles from the second insulator barrier layer into the second ferromagnetic layer;
a third ferromagnetic layer formed above the second insulator barrier layer and magnetically pinned,
wherein the second insulator barrier layer and the second diffusion stop layer are structured to effectuate tunneling of electrons between the second and the third ferromagnetic layers under a second bias voltage applied between the second and the third ferromagnetic layers; and
a third diffusion stop layer formed between the third ferromagnetic layer and the second insulator barrier layer to permit the tunneling and to prevent diffusion of particles from the second insulator barrier layer into the third ferromagnetic layer.

8. A device, comprising:
a substrate;
first and second magnetic layers formed over the substrate, wherein the first magnetic layer is located between the substrate and the second magnetic layer;
an insulator barrier layer formed between the first and second magnetic layers to effectuate tunneling of electrons between the first and second magnetic layers under a bias voltage applied between the first and second magnetic layers and across the insulator barrier layer; and
a diffusion stop layer formed between the first magnetic layer and the insulator barrier layer to permit the tunneling and prevent diffusion of particles from the insulator barrier layer into the first magnetic layer,
wherein the first magnetic layer is a magnetically pinned ferromagnetic layer whose magnetization is fixed in a first direction, and the second magnetic layer is a free ferromagnetic layer whose magnetization is controllable to be either substantially parallel to or substantially opposite to the fixed magnetization of the first ferromagnetic layer,
the device further comprising:
a non-magnetic metal spacer layer formed above the second ferromagnetic layer; and
a third ferromagnetic layer on the non-magnetic metal spacer layer and magnetically pinned to have a fixed third magnetization.

9. The device as in claim 8, wherein the diffusion stop layer is between 0.5 to 50 angstroms.

10. The device as in claim 8, wherein the diffusion stop layer is between 0.5 to 3 angstroms.

11. The device as in claim 8, wherein the diffusion stop layer comprises an oxide.

12. The device as in claim 11, wherein the oxide comprises a chromium oxide.

13. The device as in claim 11, wherein the oxide comprises a hafnium oxide.

14. The device as in claim 11, wherein the oxide comprises a zirconium oxide.

15. The device as in claim 11, wherein the oxide comprises a tantalum oxide.

16. The device as in claim 11, wherein the oxide comprises a molybdenum oxide.

17. The device as in claim 11, wherein the oxide comprises a titanium oxide.

18. The device as in claim 8, wherein the insulator barrier layer comprises a first nitride and the diffusion stop layer comprises a second nitride.

19. The device as in claim 8, wherein the insulator barrier layer comprises an aluminum oxide.

20. The device as in claim 8, wherein the insulator barrier layer comprises a magnesium oxide.

21. The device as in claim 8, wherein the first magnetic layer is ferromagnetic and is a magnetically pinned layer whose magnetization is fixed in a first direction and the second magnetic layer is ferromagnetic and is a free layer whose magnetization is controllable to be either substantially parallel to or substantially opposite to the fixed first magnetization.

22. The device as in claim 21, further comprising a control mechanism to produce a variable control magnetic field to change the direction of the second magnetization, thus altering a resistance between the first and the second ferromagnetic layers.

23. The device as in claim 21, further comprising a current control mechanism to supply and control a variable and polarized current perpendicularly flowing between the first and second ferromagnetic layers to change the direction of the second magnetization, thus altering a resistance between the first and the second ferromagnetic layers.

24. The device as in claim 8, wherein the second magnetic layer is ferromagnetic and is a magnetically pinned layer whose magnetization is fixed in a second direction and the first magnetic layer is a free ferromagnetic layer whose magnetization is controllable to be either substantially parallel to or substantially opposite to the fixed second magnetization.

25. The device as in claim 24, further comprising a control mechanism to produce a variable control magnetic field to change the direction of the first magnetization, thus altering a resistance between the first and the second ferromagnetic layers.

26. The device as in claim 24, further comprising a current control mechanism to supply and control a variable and polarized current perpendicularly flowing between the first and second ferromagnetic layers to change the direction of the first magnetization, thus altering a resistance between the first and the second ferromagnetic layers.

27. The device as in claim 8, further comprising a second diffusion stop layer formed between the second magnetic layer and the insulator baffler layer to permit the tunneling and to prevent diffusion of particles from the insulator barrier layer into the second magnetic layer.

28. The device as in claim 8, further comprising:
  a first antiferromagnetic (AFM) layer next to the first ferromagnetic layer to pin the magnetization of the first ferromagnetic layer; and
  a second antiferromagnetic (AFM) layer next to the third ferromagnetic layer to pin the magnetization of the third ferromagnetic layer.

29. The device as in claim 8, further comprising a second diffusion stop layer formed between the second ferromagnetic layer and the insulator barrier layer to permit the tunneling and to prevent diffusion of particles from the insulator baffler layer into the second ferromagnetic layer.

30. The device as in claim 8, further comprising a current control mechanism to supply and control a variable and polarized current perpendicularly flowing between the first and the third ferromagnetic layers to change the direction of the second magnetization, thus altering a resistance between the first and the second ferromagnetic layers.

31. The device as in claim 8, further comprising a second diffusion stop layer formed between the second ferromagnetic layer and the insulator barrier layer.

32. The device as in claim 8, wherein at least one of the first and second magnetic layers comprises at least two sublayers.

33. The device as in claim 8, wherein the first and second magnetic layers are ferrimagnetic layers.

34. The device as in claim 8, wherein the first and second magnetic layers are half-metal magnetic layers.

35. The device as in claim 8, wherein each magnetic layer includes a combined layer of a ferromagnetic and a ferrimagnetic layer.

36. The device as in claim 8, wherein each magnetic layer includes a combined layer of a ferromagnetic and a half-metal layer.

37. The device as in claim 8, wherein each magnetic layer includes two sublayers of ferromagnetic or ferrimagnetic or half-metal magnetic materials and a spacer between the two sublayers.

38. The devices as in claim 37, wherein the spacer comprises Ru.

39. The devices as in claim 37, wherein two sublayers are different in thickness.

40. The device as in claim 8, wherein the diffusion stop layer comprises a nitride.

41. The device as in claim 40, wherein the nitride comprises a titanium nitride.

42. The device as in claim 40, wherein the insulator barrier layer comprises an aluminum nitride.

43. The device as in claim 40, wherein the insulator barrier layer comprises an aluminum nitride.

44. A device, comprising:
  a substrate;
  first and second magnetic layers formed over the substrate, wherein the first magnetic layer is located between the substrate and the second magnetic layer;
  an insulator barrier layer formed between the first and second magnetic layers to effectuate tunneling of electrons between the first and second magnetic layers under a bias voltage applied between the first and second magnetic layers and across the insulator barrier layer; and
  a diffusion stop layer formed between the first magnetic layer and the insulator barrier layer to permit the tunneling and prevent diffusion of particles from the insulator barrier layer into the first magnetic layer
  wherein the diffusion stop layer comprises a chromium nitride, a vanadium nitride, an iron nitride or a magnesium nitride.

* * * * *

UNITED STATES PATENT AND TRADEMARK OFFICE
CERTIFICATE OF CORRECTION

PATENT NO. : 7,576,956 B2                                  Page 1 of 1
APPLICATION NO. : 11/190255
DATED : August 18, 2009
INVENTOR(S) : Yiming Huai It is certified that error appears in the above-identified patent and that said Letters Patent is hereby corrected as shown below:

IN THE SPECIFICATION:
Column 1, line 3, insert --CROSS-REFERENCE TO RELATED APPLICATION--;
Column 1, line 6, delete "MARM" and insert --MRAM--;

IN THE CLAIMS:
Column 12, line 50 (Claim 1), delete "baffler" and insert --barrier--;
Column 12, line 60 (Claim 3), delete "later" and insert --layer--;
Column 15, line 12 (Claim 27), delete "baffler" and insert --barrier--;
Column 15, line 26 (Claim 29), delete "baffler" and insert --barrier--;
Column 16, lines 21-22 (Claim 43), as claim 42 and 43 are identical, delete claim 43.

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,576,956 B2
APPLICATION NO. : 11/190255
DATED : August 18, 2009
INVENTOR(S) : Yiming Huai Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 819 days.

Signed and Sealed this

Seventh Day of September, 2010

David J. Kappos
*Director of the United States Patent and Trademark Office*